United States Patent [19]

Yamada et al.

[11] Patent Number: 4,710,854

[45] Date of Patent: Dec. 1, 1987

[54] HYBRID MULTILAYER WIRING BOARD

[75] Inventors: Minoru Yamada, Iruma; Motoyo Wajima, Hitachi; Akira Masaki, Musashino; Akio Takahashi, Hitachiota; Keiichirou Nakanishi, Kokubunji; Katuo Sugawara, Hitachi, all of Japan

[73] Assignee: Hitachi, Ltd., Tokyo, Japan

[21] Appl. No.: 24,894

[22] Filed: Mar. 10, 1987

Related U.S. Application Data

[63] Continuation-in-part of Ser. No. 844,115, Mar. 26, 1986, abandoned.

[30] Foreign Application Priority Data

Mar. 27, 1985 [JP] Japan .................................. 60-60682

[51] Int. Cl.$^4$ .......................................... H05K 01/14
[52] U.S. Cl. ..................................... 361/414; 174/68.5
[56] References Cited

U.S. PATENT DOCUMENTS

| 3,409,732 | 11/1968 | Dahlgren et al. | 361/414 X |
| 3,680,005 | 7/1972 | Jorgensen et al. | 361/414 X |
| 3,740,678 | 6/1973 | Hill | 361/414 X |
| 3,760,091 | 9/1973 | Cannizzaro et al. | 361/414 X |
| 4,030,190 | 6/1977 | Varker | 174/68.5 X |
| 4,464,732 | 8/1984 | Huie et al. | 361/414 |
| 4,560,962 | 12/1985 | Barrow | 174/68.5 X |
| 4,591,659 | 5/1986 | Leibowitz | 174/68.5 |

OTHER PUBLICATIONS

Herbert Dixon, A New Generation of Flat-Wire Packaging Techniques, Electronic Engineer's Design Ma., Sep. 1966.

Primary Examiner—R. R. Kucia
Attorney, Agent, or Firm—Antonelli, Terry & Wands

[57] ABSTRACT

A multilayer wiring board structure includes a plurality of conductor layers and insulation layers interleaved between each ones of the conductor layers. The conductor layers includes power (or ground) line layers and signal line layers, and one type of insulation layer having lower relative permittivity and another type of insulation layer having higher relative permittivity is used between power (ground) line layers interposed by signal line layer(s).

13 Claims, 7 Drawing Figures

HYBRID MULTILAYER WIRING BOARD

This application is a continuation-in-Part of application Ser. No. 844,115, filed Mar. 26, 1986 now abandoned.

BACKGROUND OF THE INVENTION

This invention relates to a wiring board for packaging electronic component parts such as semiconductor integrated circuit devices and, particularly, to a multilayer wiring board intended for fast pulse signal propagation on the board.

FIG. 6 shows an example of the conventional multilayer wiring board structure, in which the board is made of a single insulation material, e.g., glass-epoxy (with a relative permittivity of 5), and notably the insulators 51, 52 and 53 interposed between the signal line layers 5 and 6 and the ground (power) line layers 4 and 7 are made of the same insulation material 50.

A conceivable method for improving the signal propagation characteristics of a wiring board is the use of a low relative permittivity material for the insulation layers of the board. Notably, fluorocarbonic polymer such as teflon (trademark of Dupont Corporation) has extremely small relative permittivity of approximately 2 as compared with other materials, and it is a very desirable material from the viewpoint of electrical characteristics. Application of teflon to the insulation material of the wiring board has been reported in an article entitled "Finstrate: A New Concept in VLSI Packaging" by Arun K. Malhotra, et al., in Hewlett-Packard Journal, August 1983.

However, many of low relative permittivity materials are disadvantageous to the use as insulation material for wiring boards in aspects other than the electrical characteristics. For instance, the abovementioned fluorocarbonic polymer has a low glass transition temperature, lacks in the dimensional stability, and is difficult in fine patterning of lines. It also has a large thermal expansion coefficient which is greatly different from that of IC chips mounted on the board, imposing an increased possibility of thermal fatigue in the terminal section.

SUMMARY OF THE INVENTION

An object of this invention is to provide a multilayer wiring board having satisfactory signal propagation characteristics, i.e., with small wiring capacitance for minimizing the pulse signal propagation delay.

Another object of the invention is to provide a multilayer wiring board suitable for forming fine circuit patterns.

A further object of the invention is to provide a multilayer wiring board having a thermal expansion coefficient which matches with those of electronic component parts mounted on it.

In order to achieve the above objectives, the inventive wiring board includes low permittivity and high permittivity insulation layers laminated between neighboring power (ground) line layers interposed by one or more signal line layers, instead of using a uniform structure of a low relative permittivity insulation material for constructing a wiring board.

More specifically, a low relative permittivity insulation material is used for portions exposed to a high electric flux density created by signals in the signal line layers, while an insulation material having better mechanical characteristics such as higher dimensional stability and smaller thermal expansion coefficient, rather than the perfection of the relative permittivity (i.e., permitting the relative permittivity of the high dimensional stability insulation material to be somewhat large), is used for remaining portions of lower electric flux density such as the section between the power (ground) line layers and the section between the signal line layers. The section between a signal line layer and a power (ground) line layer is high in the electric flux density, and a low relative permittivity insulation layer is provided so that the signal propagation delay is minimized. For the structure of laminating power (ground) line layers and signal line layers alternately with insulation layers interleaved therebetween, a low relative permittivity material is used for the section of a smaller distance between the signal line layer and power (ground) line layer where a high electric flux density is created by the signal in the signal line layer, while a high relative permittivity material is used for the section of a larger distance between the signal line layer and power (ground) line layer where the electric flux density is low, whereby the signal propagation delay on the wiring board can be minimized.

Further, in accordance with another aspect of the present invention, the thicknesses of the insulation layer having a relatively low relative permittivity and of the insulation layer having a relatively high permittivity are determined so as to be in a specific relation as will be described later, thereby improving the signal propagation characteristics and the dimensional stability of the wiring board.

BRIEF DESCRIPTION OF THE DRAWINGS

FIG. 4b is a graph showing effective relative permittivities of the multilayer wiring board shown in FIG. 4a.

DESCRIPTION OF THE PREFERRED EMBODIMENTS

Figure 1:
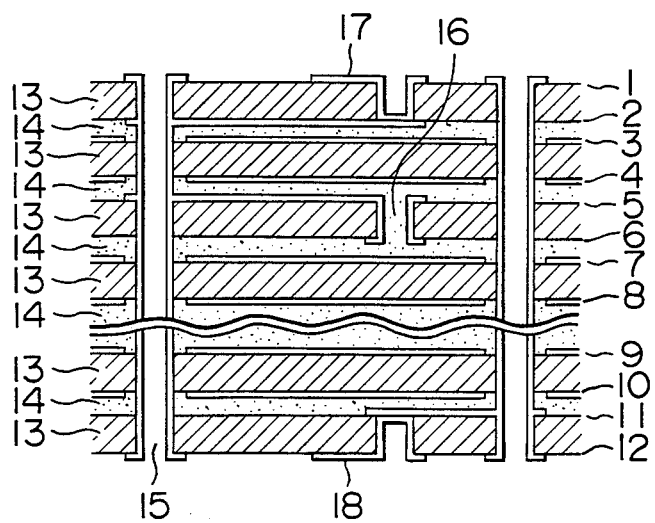
FIG. 1 is a cross-sectional view of the wiring board which is the first embodiment of this invention.

An embodiment of this invention will be described with reference to FIG. 1 showing the cross-sectional structure of a multilayer wiring board made up of a plurality of conductor layers and insulation layers. Conductor layers 1 through 12 are made of copper in a thickness of about 10 $\mu$m, insulation layers 13 of one type are made of quartz glass fabric maleimide derivatives resin in a thickness of about 50 $\mu$m, and insulation layers 14 of another type are made of fluorocarbonic polymer in a thickness of about 25 $\mu$m. A viahole 16 is used to make the electrical connection between adjacent conductor layers, and a through hole 15 is used for the electrical connection between two distant conductor layers. A surface layer has a formation of a land on which the terminal of an electronic component part is soldered. A redistribution layer 2 is provided as a rerouting line for electrically connecting the soldering land 17 to the through hole conductor 15. Conductor layers include power supply or ground layers 3, 4, 7, 8, 9 and 10 forming power supply lines or ground lines to electronic component parts, and signal line layers 5 and 6 having signal lines for electrical connections among certain through hole conductors. A bottom layer 12 has a formation of a land 18 on which a signal input/output pin is soldered. A rerouting layer 11 has a formation of a line for making electrical connection between the through hole conductor and the land 18. There are more conductor layers in a desired number of sets provided in the order of a power (ground) line layer, a signal line layer, a signal line layer, and a power (ground) line layer between the conductor layers 8 and 9 in FIG. 1, although many sets are not shown for the sake of simplicity. Namely, this embodiment consists of a total of 38 conductor layers including a surface layer, a redistribution layer, 16 signal line layers, 18 power or ground line layers, a rerouting layer, and a bottom layer.

Next, the steps of fabricating the foregoing wiring board will be described. Initially, a quartz glass fabric with a thickness of 50 $\mu$m is soaked in varnish including maleimide derivatives resin produced from N,N'-bis-maleimide and 4,4'-diaminodiphenylmethane. Then, it is dried in a temperature range of 150°-160° C. for 10 minutes so as to remove N-methyl-2-pyrrolidone which is the solvent of the varnish, and a sheet of resin impregnated fabric is produced. Thereafter, the resin impregnated fabric with aluminum card ultra-thin copper foils including a copper layer of 5 $\mu$m in thickness being placed at the top and bottom is subjected to press forming at a pressing force of 3 kg f/cm$^2$ and at a temperature of 180° C. for 90 minutes and more 180 minutes at 230° C., and a lamination board having coatings of ultra-thin copper foils on both sides of the insulation layer of 50 $\mu$m in thickness is produced. The lamination board has a relative permittivity of about 4.

After the aluminum foils on the lamination board have been etched off using the aqueous solution of sodium hydroxide, holes (viaholes) of 50 $\mu$m in diameter are formed at specified locations using the carbon dioxide laser beam. Thereafter, the board is subjected to electroless copper plating to a thickness of about 10 $\mu$m on the entire surface including the barrel of the viaholes using the electroless copper plating solution mainly including copper sulfate and ethylenediamine tetraacetate. Thereafter, the copper foils are etched off with the liquid photoresist being applied to viaholes and circuit patterns, and an internal printed board having circuit patterns on both sides is produced.

Figure 2:
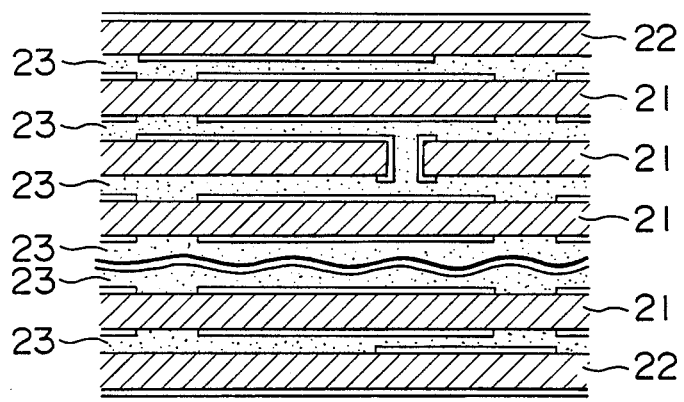
FIG. 2 is a cross-sectional view of the wiring board of FIG. 1 in the intermediate state of fabrication.

Next, a fluorocarbon copolymer bonding film No. 6700 having a relative permittivity of about 2 (product of 3M) 23 is interleaved between adjacent ones of 17 internal printed boards 21 and two external printed boards 22 as shown in FIG. 2, and the laminated structure is converted into a unitary multilayer board in the process condition of 220°, 14 kg f/cm$^2$ and 70 minutes.

Next, the viahole sections and through hole sections of the external layers are bored using the laser beam, and after the external layers and the barrel of viaholes and through hole have been plated, the circuit patterns are formed by etching on the external layers (surface layer and bottom layer) in the same way as for the internal layers, and the hybrid multilayer wiring board shown in FIG. 1 is completed.

Figure 3:
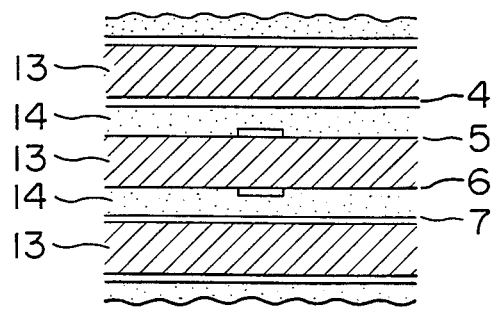
FIG. 3 is a cross-sectional view of the principal portion of the wiring board shown in FIG. 1.

Next, the effectiveness of this embodiment will be described with reference to FIG. 3 showing the principal portion of the multilayer wiring board shown in FIG. 1. The structure shown in FIG. 3 is a lamination of the signal line layers 5 and 6 and low permittivity insulation layers 13 and 14 interleaved between the neighboring ground layers 4 and 7.

An insulation layer having different relative permittivity may be laminated between the external layer and the ground layer nearest to the external layer.

The signal line layers 5 and 6 and the ground (power) line layers 4 and 7 are formed in strip lines. The embodiment consisting of the insulation layers 14 having a relative permittivity of 2 and thickness of 25 $\mu$m, the insulation layers 13 having a relative permittivity of 4 and thickness of 50 $\mu$m and the signal lines of 40 $\mu$m in width and 15 $\mu$m in thickness has effective relative permittivity of approximately 2.4 evaluated by the simulation. The relative permittivity is reduced by about 40% from the case of constructing both insulation layers 13 and 14 with the same material having a relative permittivity of 4, whereby the capacitance of wiring can be reduced significantly and the signal propagation delay can be minimized. Fluorocarbonic polymer which is inferior in dimensional stability is used only for the bonding layer, and misregistration is avoided. By laminating sheets of fluorocarbonic polymer having an extremely large terminal expansion coefficient of around $55 \times 10^{-6}/°$ C. and quartz glass fabric maleimide derivatives resin having a thermal expansion coefficient of around $14 \times 10^{-6}/°$ C., the effective thermal expansion coefficient of the overall wiring board can be reduced significantly. The significant reduction in the effective relative permittivity is based on the construction of the insulation layer 14 between a signal line layer and the nearest ground (power) layer, where the electric flux density of the signal is high, using low permittivity material, and the thickness of the insulation layer of a low relative permittivity is about one-half that of the insulation layer 13 of a high relative permittivity.

In the above-described embodiment, use is made of a lamination of an insulation layer 14 having a relative permittivity of 2 and an insulation layer 13 having a relative permittivity of 4 and the relation between the thicknesses of the insulation layers is 1:2, with a result that the effective relative permittivity is reduced to 2.4. This effective relative permittivity is, however, variable depending upon the ratio between the thicknesses of the low relative permittivity insulation layer 14 and of the high relative permittivity insulation layer 13.

Figure 4A:
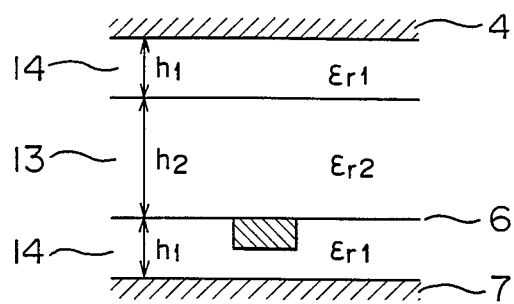
FIG. 4a is a diagram of the major part of the structure shown in FIG. 3.

Reference will now be made to FIG. 4a showing the major part of a multilayer wiring board structure according to an embodiment of the present invention including the signal line layer 6, the power-(ground) line layers 4 and 7 laminated over one another with the insulation layers 13 and 14 interposed therebetween. Although FIG. 4a is identical with FIG. 3, indication of the signal line layer 5 is omitted in FIG. 4a, since FIG. 4a is intended to illustrate the effective relative permittivity. In FIG. 4a, two kinds of insulation materials are used to constitute a three-layer structure in which the insulation layer 13 having a relative permittivity of $\epsilon_{r2}$ and a thickness of $h_2$ is sandwiched between the two insulation layers 14 having a relative permittivity of $\epsilon_{r1}$ and a thickness of $h_1$, and $\epsilon_{r1} < \epsilon_{r2}$.

Figure 4B:
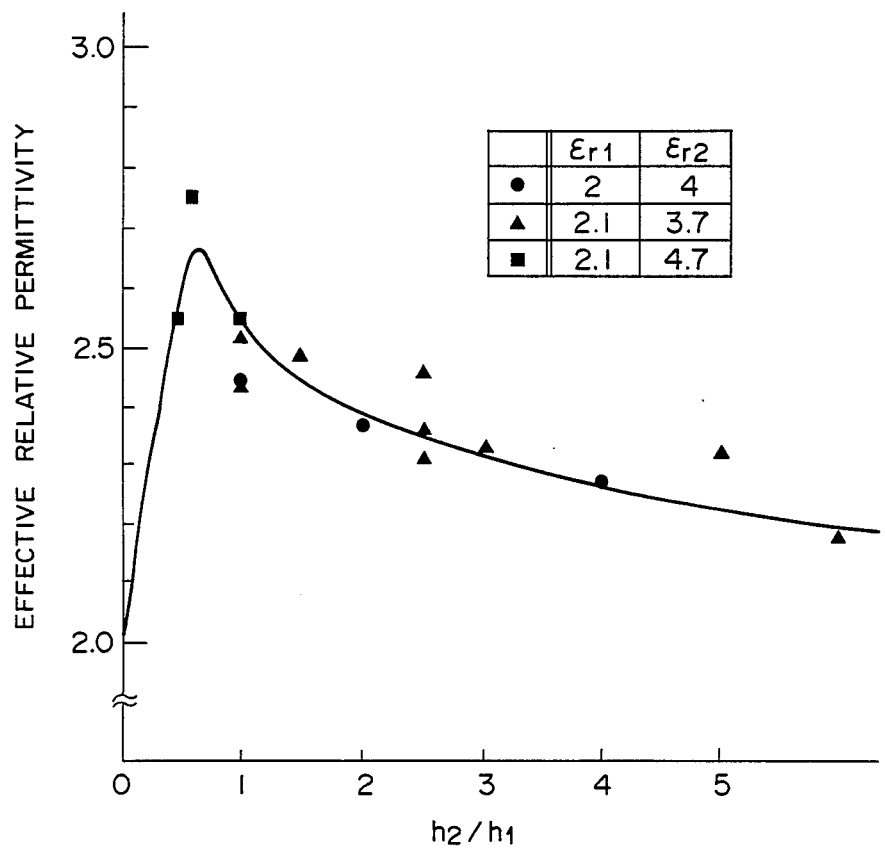

FIG. 4b shows the dependence of the effective relative permittivity for the structure shown in FIG. 4a upon the ratio $h_2/h_1$ of the two kinds of dielectric insulation materials constituting the layers 13 and 14. It should be noted that an "effective relative permittivity" designates a value for a relative permittivity which will be needed, in order to obtain the same signal propagation characteristics as those of the structure shown in FIG. 4a, for a structure consisting of a signal line layer and power (ground) line layers having shapes and sizes identical with those of the layers 6, 4 and 7 shown in FIG. 4a and a single kind of insulation material constituting all of the three insulation layers 13 and 14 shown in FIG. 4a. In other words, the effective relative permittivity is indicative of how low relative permittivity the two kinds of dielectric insulation materials employed in the structure shown in FIG. 4a is equivalently considered to be regarded as a single dielectric insulation material. In FIG. 4b, results of calculation of the effective relative permittivity are shown for three sets of different relative permittivities $\epsilon r_1$ and $\epsilon r_2$ for layers 13 and 14. That is, round dots, triangular dots and squares dots are respectively representative of the following cases:

● — $\epsilon r_1 = 2$, $\epsilon r_2 = 4$ FIG. 4a embodiment)
▲ — $\epsilon r_1 = 2.1$, $\epsilon r_2 = 3.7$
■ — $\epsilon r_1 = 2.1$, $\epsilon r_2 = 4.7$ It can be seen that the effective relative permittivity has a tendency to generally vary along the solid line curve in each case. Namely, the effective relative permittivity assumes a maximum value for $h_2/h_1$ being 0.6 and thus it decreases at the ratio $h_2/h_1$ deviates from 0.6. This may be explained quantitatively as follows. For $h_2/h_1 = 0$ or $h_2 = 0$, the space between the power (ground) line layers 4 and 7 is now filled with an insulation material of a relative permittivity of $\epsilon r_1$, so that the effective relative permittivity becomes equal to $\epsilon r_1$. As the $h_2/h_1$ increases, the rate of the insulation material with respect to a relative permittivity $\epsilon r_2$ occupying the space between the power (ground) layers 4 and 7 increases, so that the effective relative permittivity approaches $\epsilon r_2$ gradually. Here, it might be considered that the effective relative permittivity will become almost equal to $\epsilon r_2$, if the ratio $h_2/h_1$ increases sufficiently. Actually, however as the ratio $h_2/h_1$ increases to exceed a value of 0.6, the effective relative permittivity increases to a maximum and then begins to decrease towards $\epsilon r_1$ as $h_2/h_1$ increases beyond 0.6, as shown in FIG. 4b. This is for the following reasons.

Increasing the ratio $h_2/h_1$ means that the distance between the signal line layer 6 and the upper power (ground) line layer 4 is getting larger than that between the layer 6 and the lower power (ground) line layer 7. Thus, if the distance between the layers 6 and 4 becomes larger than a predetermined one, almost all of the lines of electric force emanating from the signal line layer 6 towards the power (ground) lines layers 4 and 7 will be eventually absorbed by the lower, i.e. nearer power (ground) layer 7. In other words, when the insulation layer 13 (relative permittivity $\epsilon r_2$, thickness $h_2$) is relatively not so thick, the number of lines of electric force from the signal line layer 6 to the upper power (ground) line layer 4 is almost the same as that from the layer 6 to the lower power (ground) line layer 7, so that the resulting effective permittivity increases with an increase of $h_2/h_1$ due to the influence of lines of electric force passing through the insulation layer 13 having $\epsilon r_2$. On the other hand, when the layer 13 is sufficiently thick, the number of lines of electric force emanating from the signal line layer 6 and getting to the upper power (ground) line layer 4 is small as compared with that emanating from the signal line layer 6 and getting to the lower power (ground) line layer 7, which will result in the effective relative permittivity approaching $\epsilon r_1$.

It can be seen from FIG. 4b that values for $h_2/h_1$ realizing low effective relative permittivity which is desirable from the viewpoint of the enhancement of the signal propagation characteristics exist on both sides of 0.6 on the abscissa providing the maximum effective relative permittivity. In the range $h_2/h_1 \leq 0.6$, the effective relative permittivity increases with an increase of $h_2/h_1$, while in the range $h_2/h_1 \geq 0.6$, the effective relative permittivity decreases with an increase of $h_2/h_1$. While low relative permittivity dielectric insulation materials generally have properties unsuitable for use as insulators in a wiring board except with respect to the electric characteristics, as described previously, and particularly their dimensional stability is so poor that miniaturization of wiring patterns is difficult, miniaturization of wiring patterns is essential in the increase of the density of packaging semiconductor chips on a wiring board and in the reduction of the signal propagation time. In order to provide excellent signal propagation characteristics and a high dimensional stability with a wiring board, it has been determined that the ratio $h_2/h_1$ is about 1.4 or higher.

Figure 5:
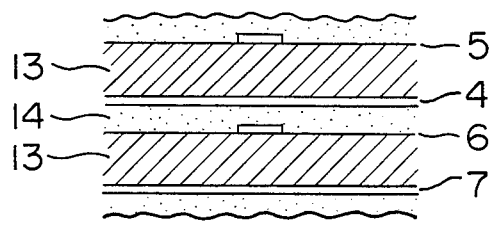
FIG. 5 is a cross-sectional view of the principal portion of the wiring board which is the second embodiment of this invention.
Figure 6:
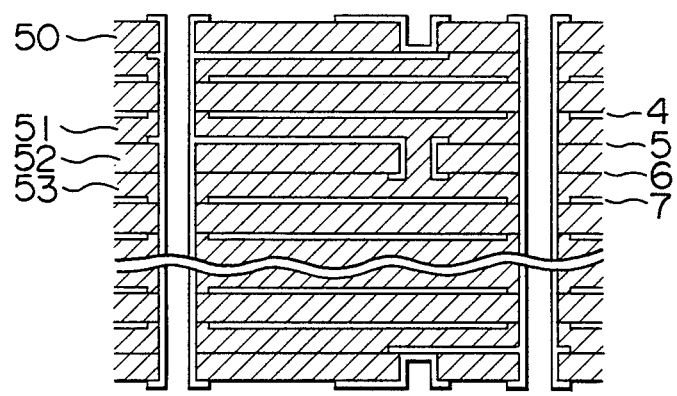
FIG. 6 is a cross-sectional view of the conventional wiring board.

FIG. 5 shows the second embodiment of this invention. The figure shows only a principal portion of the internal layers. This hybrid multilayer wiring board consists of internal signal line layers 5 and 6 and ground (power) line layers 4 and 7 laminated alternately with an insulation layer interleaved therebetween. Low permittivity material 14 is used for insulation layers with a small distance between the signal and ground (power) line layers where a high electric flux density is created by the signal, and high permittivity material 13 is used for insulation layers providing a large distance between the active layers. In this embodiment, the layer 14 of low relative permittivity material has a thickness of 25 $\mu$m, and the layer 13 of high relative permittivity material has a thickness of 50 $\mu$m. The insulation layers for the external surfaces are preferably made of the high relative permittivity material (13). Although in this embodiment fluorocarbonic polymer and glass fabric maleimide derivatives resin are used, other combination of materials are also possible.

As an example, a sheet of glass fabric is soaked in varnish which is made from 60 p.h.r. of 1,2-polybutadiene (RB-810, product of Japan Synthetic Rubber Co., Ltd.), 40 p.h.r. of ester modified 1,2-polybutadiene (product of Nippon Soda Co., Ltd.), and 0.5 p.h.r. of dicumylperoxide, solved in 120 p.h.r. of xylene. The sheet is dried at 100°–110° C. for 20 minutes, and prepreg including 50 weight percent of resin is produced. The prepreg is used in place of the fluorocarbon copolymer bonding film in the preceding embodiment, and it is converted to a multilayer board through the bonding process at 170° C., 20 kg f/cm² for 60 minutes and the hardening process at 200° C. for 120 minutes.

The present invention is summarized as follows. A plurality of insulation layers having different relative permittivity are placed between neighboring power (ground) layers with interposed by one or more signal line layers, the first insulation material being of low relative permittivity for use in the portion between a signal line layer and a ground (power) layer where electric flux density is high, and the second insulation material being of higher relative permittivity, but more suitable as laminating material than the first material.

The first and second insulation layers need not be formed of a uniform material, but may be formed of a plurality of materials.

This invention enables the reduction in the effective relative permittivity of insulation layers of the wiring board thereby to improve the signal propagation characteristics of the board. The inventive wiring board structure is suitable for arranging fine circuit patterns, because of its easy prevention of misregistration of layers. Moreover, the inventive wiring board structure provides easiness of matching the thermal expansion coefficient of the board with those of electronic component parts mounted on it.

We claim:

1. A multilayer wiring board comprising a plurality of conductor layers formed one over another each serving as either one of a power/ground line layer and a signal line layer, and a plurality of insulation layers each interposed between two adjacent ones of said conductor layers, wherein each of said insulation layers which are respectively interposed between two adjacent ones of said conductor layers serving as two power/ground layers with at least one conductor layer serving as a signal line layer also interposed between the two adjacent power/ground line layers is constituted by first and second insulating layer members formed one on the other, said second insulating layer member having a relative permittivity higher than that of said first insulating layer member, said first insulating layer member is disposed in a portion between the adjacent conductor layers serving as power/ground line layers where the density of electric flux created by a signal propagating in said signal line layer is relatively high and said second insulating layer member is disposed in a portion between the adjacent conductor layers serving as power/ground line layers where the density of electric flux created by a signal propagating in said signal line layer is relatively low, and the ratio of the thickness of said second insulating layer member with respect to that of said second insulating layer member is not smaller than about 1.4.

2. A multilayer wiring board according to claim 1, wherein said ratio between the thicknesses of said first and second insulating layer members is substantially 2.

3. A multilayer wiring board according to claim 1, wherein four successively adjacent conductor layers serve as a first power/ground line layer, a first signal line layer, a second signal line layer and a second power/ground line layer, in which one said first insulating layer member is provided between said first power/ground line layer and first signal line layer and another one said first insulating layer member is provided between said second signal layer and second power/ground line layer, and more than one combination essentially consisting of said four successively adjacent conductor layers and said first insulating layer members are included in the multilayer wiring board.

4. A multilayer wiring board according to claim 3, wherein said second insulating layer members are provided one for each of between two adjacent ones of said power/ground line layers with no signal line layer interposed therebetween and between two adjacent ones of said signal lines with no power/ground line layer interposed therebetween.

5. A multilayer wiring board according to claim 1, wherein the outermost one of said insulation layers is constituted by one said second insulating layer member.

6. A multilayer wiring board according to claim 1, wherein a plurality of said conductor layers serving as signal line layer and a plurality of different ones of said conductor layers serving as power/ground line layers are alternately arranged with said first and second insulating layer members being alternately interposed between one of said conductor layers serving as signal lines layers and one of said conductor layers serving as power/ground line layers adjacent to each other.

7. A multilayer wiring board according to claim 1, wherein said first insulating layer member is made of a fluorocarbon derivatives polymer.

8. A multilayer wiring board according to claim 1, wherein said second insulating layer member is made of a maleimide derivatives resin.

9. A multilayer wiring board comprising a plurality of insulative sheets laminated one over another with insulation layers interposed therebetween, wherein each of said insulative sheets has a conductor layer on at least one of its surfaces, said conductor layer serving as one of a power/ground line layer and a signal line layer, the conductor layer serving as a power/ground line layer is opposed to the conductor layer serving as a signal line layer, and each of said insulation layers has a relative permittivity smaller than that of said insulative sheet and has a thickness such that the ratio of the thickness of said insulative sheet with respect to that of said insulation layer is not smaller than about 1.4.

10. A multilayer wiring board according to claim 9, wherein each of at least two of said insulative sheets has on its surface of conductor layer serving as a signal line layer and another conductor layer serving as a power/ground line layer, respectively.

11. A multilayer wiring board according to claim 9, wherein at least one of said insulative sheets has on its surfaces conductor layers serving as power/ground line layers, at least different one of said insulative sheets has on its surfaces conductor layers serving as signal line layers, and said at least one insulative sheets with said conductor layers serving as power/ground line layers and said at least one insulative sheet with conductor layers serving as signal line layers are alternately laminated.

12. A multilayer wiring board according to claim 9, wherein each of said insulation layers is made of a fluorocarbon derivatives polymer.

13. A multilayer wiring board according to claim 9, wherein each of said insulative sheets is made of maleimide derivatives resin.

* * * * *